United States Patent
Pan et al.

(10) Patent No.: US 8,917,549 B2
(45) Date of Patent: Dec. 23, 2014

(54) NOR FLASH MEMORY ARRAY STRUCTURE, MIXED NONVOLATILE FLASH MEMORY AND MEMORY SYSTEM COMPRISING THE SAME

(71) Applicant: Tsinghua University, Beijing (CN)

(72) Inventors: Liyang Pan, Beijing (CN); Lifang Liu, Beijing (CN)

(73) Assignee: Tsinghua University, Beijing (CN)

(*) Notice: Subject to any disclaimer, the term of this patent is extended or adjusted under 35 U.S.C. 154(b) by 40 days.

(21) Appl. No.: 13/806,314

(22) PCT Filed: Nov. 30, 2012

(86) PCT No.: PCT/CN2012/085655
§ 371 (c)(1),
(2), (4) Date: Dec. 21, 2012

(87) PCT Pub. No.: WO2013/079020
PCT Pub. Date: Jun. 6, 2013

(65) Prior Publication Data
US 2014/0063957 A1    Mar. 6, 2014

(30) Foreign Application Priority Data
Dec. 2, 2011 (CN) .......................... 2011 1 0398045
Jan. 5, 2012 (CN) .......................... 2012 1 0002254

(51) Int. Cl.
*G11C 16/04* (2006.01)
*H01L 21/28* (2006.01)
*H01L 29/10* (2006.01)
*H01L 27/115* (2006.01)
*H01L 29/792* (2006.01)
*G11C 11/56* (2006.01)

(52) U.S. Cl.
CPC ...... *G11C 16/0466* (2013.01); *H01L 21/28282* (2013.01); *G11C 16/0475* (2013.01); *H01L 29/1041* (2013.01); *H01L 27/11563* (2013.01); *H01L 29/7923* (2013.01); *G11C 16/0483* (2013.01); *G11C 11/5621* (2013.01)
USPC ............. 365/185.03; 365/185.17; 365/185.33

(58) Field of Classification Search
USPC ........................................ 365/185.33, 185.03
See application file for complete search history.

(56) References Cited

U.S. PATENT DOCUMENTS 6,862,223 B1 * 3/2005 Lee et al. ................. 365/185.33
6,937,513 B1 * 8/2005 Desai et al. .............. 365/185.11
(Continued)

FOREIGN PATENT DOCUMENTS

| CN | 1841754 | 10/2006 |
|---|---|---|
| CN | 101004798 | 7/2007 |

(Continued)

OTHER PUBLICATIONS

Gu Haiming, Pan Liyang et al., Novel multi-bit non-uniform channel charge trapping memory device with virtual-source NAND flash array, Journal of Semiconductors, vol. 31, No. 10, 104009-1-104009-5, Oct. 2010.

*Primary Examiner* — Son Mai
(74) *Attorney, Agent, or Firm* — Hodgson Russ LLP (57) ABSTRACT

A NOR flash memory array structure is provided, comprising: a substrate (100); and a two dimensional memory array structure formed on the substrate (100) and comprising: a plurality of memory cell columns arranged in a first direction, and each memory cell column including a plurality of memory cells (300), in which each memory cell (300) comprises: a channel region (308) located on the substrate (100), a gate structure located on the channel region (308) and formed by a tunneling oxide layer (304), a silicon nitride layer (303), a barrier oxide layer (302) and a polysilicon gate layer (301) stacked sequentially, a source region (306) and a drain region (305) located at a first edge and a second edge of the gate structure respectively; a plurality of word lines WL; a source line SL for connecting the source regions of all the memory cells; and a plurality of bit lines BL.

16 Claims, 6 Drawing Sheets

(56) References Cited

U.S. PATENT DOCUMENTS

| | | | |
|---|---|---|---|
| 7,158,411 B2 * | 1/2007 | Yeh et al. | 365/185.18 |
| 7,177,190 B2 * | 2/2007 | Lee | 365/185.17 |
| 7,738,304 B2 * | 6/2010 | Maayan et al. | 365/185.33 |
| 7,817,472 B2 * | 10/2010 | Kuo et al. | 365/185.12 |
| 8,289,775 B2 * | 10/2012 | Lee et al. | 365/185.18 |
| 8,341,338 B2 * | 12/2012 | Lee et al. | 711/103 |
| 2008/0130359 A1 | 6/2008 | Maayan et al. | |
| 2008/0140948 A1 | 6/2008 | Pyeon et al. | |
| 2009/0086548 A1 | 4/2009 | Wu et al. | |
| 2010/0329011 A1 * | 12/2010 | Lee et al. | 365/185.17 |
| 2012/0072647 A1 * | 3/2012 | Lee et al. | 711/103 |

FOREIGN PATENT DOCUMENTS

| | | |
|---|---|---|
| CN | 101101926 | 1/2008 |
| CN | 102509727 | 6/2012 |
| CN | 102544022 | 7/2012 |
| JP | 10-214846 | 8/1998 |

\* cited by examiner

NOR FLASH MEMORY ARRAY STRUCTURE, MIXED NONVOLATILE FLASH MEMORY AND MEMORY SYSTEM COMPRISING THE SAME

CROSS-REFERENCE TO RELATED APPLICATION

This patent application is a 371 national stage patent application based on International Patent Application No. PCT/CN2012/085655, filed Nov. 30, 2012, entitled "NOR FLASH MEMORY ARRAY STRUCTURE, MIXED NONVOLATILE FLASH MEMORY AND MEMORY SYSTEM COMPRISING THE SAME," which claims priority to Chinese Patent Application Number 201110398045.5, filed with the State Intellectual Property Office of P. R. China on Dec. 2, 2011; and Chinese Patent Application Number 201210002254.8, filed with the State Intellectual Property Office of P. R. China on Jan. 5, 2012, which are all incorporated herein by reference in their entirety.

FIELD

The present disclosure relates to a memory technology field, and more particularly to a NOR flash memory array structure, a mixed nonvolatile flash memory and a memory system comprising the mixed nonvolatile flash memory.

BACKGROUND

A flash memory array structure may be divided into a NAND type and a NOR type according to a logic structure thereof.

Figure 1:
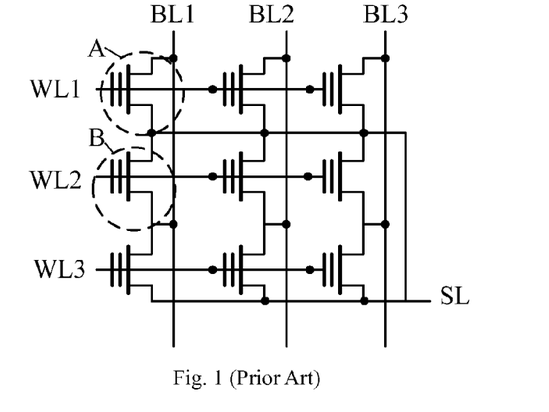
FIG. 1 is an equivalent circuit diagram showing a conventional NOR flash array with a single-transistor parallel structure.

As shown in FIG. 1, a conventional NOR flash array has a single-transistor parallel structure. When an erasing operation is performed in a memory block, influenced by various elements such as process conditions and operation conditions, the erasing operation may lead partial cells to an over erasing state. As shown in FIG. 1, when reading a cell A, if the over erasing occurs to a cell B, a threshold voltage of the cell B is minus, thus causing a leakage, that is, a current of a bit line BL1 is an sum of a current of the cell A and a current of the cell B, which may cause a reading fault and a redundant power consumption. For an independent NOR flash, a complicated algorithm is usually introduced to solve an over erasing problem. For instance, an erasing verification is performed after the erasing operation. If there are over erased cells, a soft programming operation is performed to a full block until the threshold voltages thereof are programmed above zero using a low gate voltage. The verification and soft programming operation are repeated until a proportion of the over erased cells satisfies a requirement. The complicated algorithm increases a complexity of a peripheral control circuit.

Figure 2:
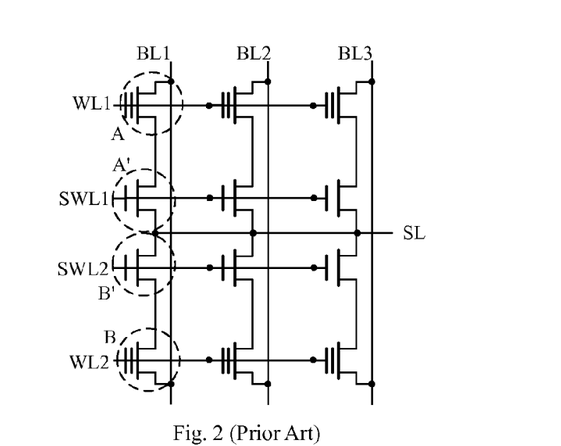
FIG. 2 is an equivalent circuit diagram showing a conventional eNOR flash array with a double-transistor parallel structure.

Because the complicated algorithm mentioned above may greatly increase a complexity of a whole system, an introduction of the complicated algorithm is obviously not applicable for an eNOR flash (embedded-NOR flash). For the eNOR flash, a double-transistor parallel structure is usually used to solve the over erasing problem. As shown in FIG. 2, a MOSFET (metal-oxide-semiconductor field effect transistor) is disposed at a source region of each cell to control a selection of the cell. In this way, when reading a cell A, even the over erasing occurring to a cell B after the erasing operation, the leakage of cell B may not influence a current in a bit line BL1, because a transistor B' connected with the cell B in series is off. In addition, this solution may simplify the peripheral control circuit. However, a storage density is greatly reduced because of the double-transistor cell structure.

Therefore, there is a need for a nonvolatile memory with a NOR type array structure which has advantages of a low power consumption, a high storage density and a simple peripheral control circuit.

In addition, a NAND type flash and a NOR type flash have complementary advantages and disadvantages because of their structure differences. For instance, the NAND type flash is applicable for a data storage with high density and mass capacity because of a compact array structure, while the NAND type flash has disadvantages of a low reading speed and a non-supporting code local execution. In contrast, the NOR type flash is applicable for a mass program storage because of a high reading speed and a code local-executed property, while the NOR type flash has disadvantages of a low storage density and a small capacity, and thus it is not applicable for the mass data storage.

Therefore, there is a need for a memory structure to realize the high speed reading, the code local execution and the mass data storage simultaneously.

SUMMARY

The present disclosure is aimed to solve at least one of the problems. Accordingly, a NOR flash memory array structure, a mixed nonvolatile flash memory and a memory system comprising the mixed nonvolatile flash memory are provided.

According to a first aspect of the present disclosure, a NOR flash memory array structure is provided. The NOR flash memory array structure comprises: a substrate; and a two dimensional memory array structure formed on the substrate and comprising: a plurality of memory cell columns arranged in parallel in a first direction, two adjacent memory cell columns isolated from each other and each memory cell column including a plurality of memory cells, wherein each memory cell is a silicon-oxide-nitride-oxide-silicon (SONOS), comprising: a channel region located on the substrate, a gate structure located on the channel region and formed by a tunneling oxide layer, a silicon nitride layer, a barrier oxide layer and a polysilicon gate layer stacked sequentially, a source region located in the substrate and at a first edge of the gate structure, and a drain region located in the substrate and at a second edge of the gate structure; a plurality of word lines arranged in parallel in a second direction and each configured to connect the gate structures of the memory cells in a same row; a source line for connecting the source regions of all the memory cells; and a plurality of bit lines arranged in parallel in the first direction and each configured to connect the drain regions of the memory cells in a same column, the plurality of bit lines crossing the plurality of word lines and the source line.

In one embodiment, each memory cell stores two bits of information with one bit as a storage bit and the other bit as a selection bit.

In one embodiment, the two bits of information are stored in portions of the silicon nitride layer adjacent to the source region and the drain region respectively.

In one embodiment, two adjacent memory cells in each memory cell column are connected in series opposition to allow the source regions of the two adjacent memory cells to be connected to the source line, or to allow the drain regions of the two adjacent memory cells to be connected to a same bit line, so as to increase a spacial utilization rate.

In one embodiment, the substrate is a p-type semiconductor substrate, and each memory cell comprises: a p-well formed in the p-type semiconductor substrate, and the channel region formed on the p-well and nonuniformly doped in a horizontal direction with p+/n−/p+, p+/p−/p+, or p+/depletion region/p+. As a single memory cell with such structure may store two bits of information which are stored in a charge trapping layer (the silicon nitride layer) near a source region and a drain region of the memory cell respectively, one bit may be used as a storage bit and the other bit as a selection bit. Each memory cell may be equivalent to one storage transistor and one selection transistor controlled by a same gate, that is the one storage transistor and the one selection transistor are realized in a single SONOS memory. The NOR flash memory array formed by the SONOS memory is called a single-transistor parallel structure, which may not only increase a storage density, but also avoid problems resulting from the over erasing, thus simplifying a peripheral control circuit.

The NOR flash memory array structure according to embodiments of the present disclosure is formed by double-bit SONOS memory cells to realize the single-transistor parallel structure. By applying the NOR flash memory array structure to an independent NOR flash, the peripheral control circuit may be simplified and an erasing speed may be increased greatly; by applying the NOR flash memory array structure to an embedded NOR flash, problems (such as leakage and reading fault) resulting from the over erasing may be avoided, a power consumption may be lowered and the storage density may be greatly increased.

According to a second aspect of the present disclosure, a mixed nonvolatile flash memory is provided. The mixed nonvolatile flash memory comprises: a semiconductor substrate; a first memory array formed on the semiconductor substrate and comprising: a plurality of memory cell columns arranged in parallel in a first direction, two adjacent memory cell columns isolated from each other and each memory cell column including a plurality of first memory cells; a plurality of first word lines arranged in parallel in a second direction and each configured to connect gate structures of the first memory cells in a same row; a first source line in the second direction for connecting source regions of all the first memory cells; and a plurality of first bit lines arranged in parallel in the first direction and each configured to connect drain regions of the first memory cells in a same column, the plurality of first bit lines crossing the plurality of first word lines and the first source line; and a second memory array formed on the semiconductor substrate and comprising: a plurality of serial structures arranged in parallel in the first direction and in the second direction, each serial structure including one first selection transistor, a plurality of second memory cells and one second selection transistor, two adjacent serial structures in the first direction isolated from each other; a plurality of second word lines arranged in parallel in the second direction and each configured to connect gate structures of the second memory cells in a same row; a plurality of first selection lines arranged in parallel in the second direction and each configured to connect gate electrodes of the first selection transistors in a same row; a plurality of second selection lines arranged in parallel in the second direction and each configured to connect gate electrodes of the second selection transistors in a same row; and a plurality of second bit lines arranged in parallel in the first direction, the plurality of second bit lines crossing the plurality of first selection lines and the plurality of second selection lines, drain regions of the first selection transistors of the serial structures in a same column connected with one of the second bit lines which are adjacent to the serial structures in the same column, source regions of the second selection transistors of the serial structures in the same column connected with the other of the second bit lines which are adjacent to the serial structures in the same column; wherein structures of the first memory cell and the second memory cell are identical, and each of the first memory cell and the second memory cell comprises: a channel region located on the semiconductor substrate, a gate structure located on the channel region and formed by a tunneling oxide layer, a silicon nitride layer, a barrier oxide layer and a polysilicon gate layer stacked sequentially, a source region located in the substrate and at a first edge of the gate structure, and a drain region located in the substrate and at a second edge of the gate structure.

In one embodiment, each first memory cell and each second memory cell each store two bits of information with one bit as a storage bit and the other bit as a selection bit.

In one embodiment, the two bits of information are stored in portions of the charge trapping layer adjacent to the source region and the drain region respectively.

In one embodiment, the semiconductor substrate is a p-type semiconductor substrate, and each first memory cell and each second memory cell comprise: a p-well formed in the p-type semiconductor substrate, and the channel region formed on the p-well and non-uniformly doped in a horizontal direction with p+/n−/p+, p+/p−/p+, or p+/depletion region/p+.

In one embodiment, two adjacent first memory cells in each memory cell column are connected in series opposition to allow the source regions of the two adjacent first memory cells to be connected to the first source line, or to allow the drain regions of the two adjacent first memory cells to be connected to a same first bit line so as to simplify a structure of the first memory array, thus reducing an area of a memory chip.

In one embodiment, two adjacent serial structures in the second direction are connected in series opposition to allow the drain regions of the first selection transistors in the two adjacent serial structures to be connected to one second bit line adjacent to the two adjacent serial structures, or to allow the source regions of the second selection transistors in the two adjacent serial structures to be connected to the other second bit line adjacent to the two adjacent serial structures, so as to simplify a structure of the second memory array, thus reducing an area of a memory chip.

According to a third aspect of the present disclosure, a memory system comprising the mixed nonvolatile flash memory according to the second aspect of the present disclosure is provided.

In one embodiment, each first memory cell and each second memory cell store two bits of information, which are stored in portions of the silicon nitride layer (the charge trapping layer) adjacent to the source region and the drain region respectively.

In one embodiment, the semiconductor substrate is a p-type semiconductor substrate, and each first memory cell and each second memory cell comprise: a p-well formed in the p-type semiconductor substrate, and the channel region formed on the p-well and non-uniformly doped in a horizontal direction with p+/n−/p+, p+/p−/p+, or p+/depletion region/p+.

In one embodiment, two adjacent first memory cells in each memory cell column are connected in series opposition to allow the source regions of the two adjacent first memory cells to be connected to the first source line, or to allow the drain regions of the two adjacent first memory cells to be connected to a same first bit line so as to simplify a structure of the first memory array, thus reducing an area of a memory chip.

In one embodiment, two adjacent serial structures in the second direction are connected in series opposition to allow the drain regions of the first selection transistors in the two adjacent serial structures to be connected to one second bit line adjacent to the two adjacent serial structures, or to allow the source regions of the second selection transistors in the two adjacent serial structures to be connected to the other second bit line adjacent to the two adjacent serial structures, so as to simplify a structure of the second memory array, thus reducing an area of a memory chip.

In one embodiment, the first memory array is a program memory for storing program to realize a fast program reading speed and a code local execution, and the second memory array is a data memory for storing data to realize a mass data storage.

In one embodiment, the memory system further comprises: a microprocessor; and a random access memory for temporarily storing data; in which the program memory, the data memory and the random access memory are connected with the microprocessor respectively to execute storage commands under a control of the microprocessor.

In one embodiment, the program memory, the data memory and the random access memory are connected with the microprocessor via an address bus and a data bus respectively.

With the mixed nonvolatile flash memory according to embodiments of the present disclosure, by using a high density double-bit non-uniform channel device as the memory cell to form a NOR type array (the first memory array) and a NAND type array (the second memory array) on a same chip, a single-chip mixed storage of a NOR flash and a NAND flash is thus realized with following advantages.

(1) Functionally, the single memory cell in the NOR type array may be equivalent to one storage transistor and one selection transistor controlled by a same gate. The storage transistor is used for storing information, while the selection transistor is used for selecting the memory cell by switching on or off the selection transistor. The NOR type array structure may not only increase the program storage density, but also avoid the leakage problem resulting from the over erasing, thus simplifying the peripheral control circuit.

(2) The single memory cell in the NAND type array may not only realize one-bit storage, double-bit storage and multi-level storage, but also realize programming, and forward and reverse reading. The NAND array structure has advantages of mass data storage capacity, flexible operation, small cell area, high integration, low power consumption, low cost, and thus meeting requirements of small size and high density for nonvolatile memory developments.

(3) The NOR array and the NAND array of the double-bit non-uniform channel device may be fabricated by an identical process flow so that a real integration of the NOR flash and the NAND flash may be realized, which may not only reduce the area of the whole memory chip, but also has advantages of NAND mass data storage capacity and NOR fast program storage.

(4) The memory system based on the mixed nonvolatile flash memory may be applied to various smart cards or memory cards, such as an ID smart card, a phone smart card, a mobile SIM card and a safety digital (SD) card. Both data and program may be stored in the memory system, which may help to simplify a system configuration of an electronic digital product, to increase a running speed of the system and to reduce the power consumption.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

It is to be understood that phraseology and terminology used herein with reference to device or element orientation (such as, terms like "longitudinal", "lateral", "front", "rear", "right", "left", "lower", "upper", "horizontal", "vertical", "above", "below", "up", "top", "bottom" as well as derivative thereof such as "horizontally", "downwardly", "upwardly", etc.) are only used to simplify description of the present invention, and do not alone indicate or imply that the device or element referred to must have or operated in a particular orientation.

In addition, terms such as "first" and "second" are used herein for purposes of description and are not intended to indicate or imply relative importance or significance or imply a number of technical features indicated. Therefore, a "first" or "second" feature may explicitly or implicitly comprise one or more features. Further, in the description, unless indicated otherwise, "a plurality of" refers to two or more.

According to a first aspect of the present disclosure, a NOR flash memory array structure and an operation thereof are provided. The embodiments will be described herein with reference to the accompanying drawings.

Figure 3:
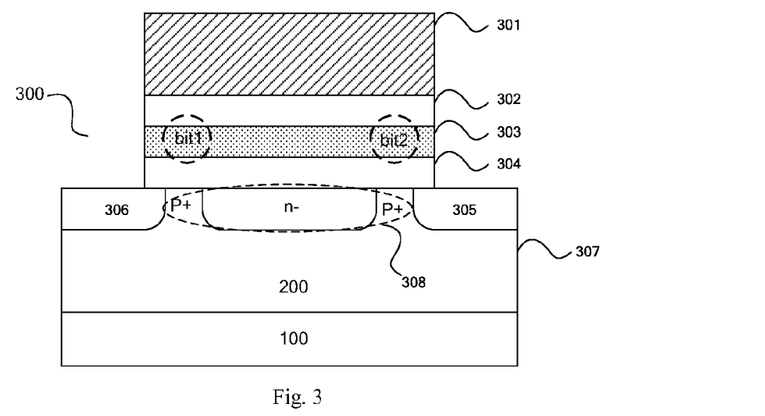
FIG. 3 is a cross-sectional view showing a SONOS memory according to one embodiment of the present disclosure.

FIG. 3 is a cross-sectional view of a SONOS memory 300 according to one embodiment of the present disclosure. The SONOS memory is located on a substrate 100. In this embodiment, the substrate 100 is a p-type semiconductor substrate. The memory 300 comprises: a p-well 200 formed in the p-type semiconductor substrate 100; a channel region 308 located on the p-well 200 and non-uniformly doped in a horizontal direction with p+/n–/p+ (as shown in FIG. 3), p+/p–/p+, or p+/depletion region/p+; a gate structure located on the channel region 308 and formed by a tunneling oxide (such as silicon oxide) layer 304, a charge trapping (such as silicon nitride) layer 303, a barrier oxide (such as silicon oxide) layer 302 and a gate electrode (such as polysilicon) layer 301 stacked sequentially; a source region 306 located in the substrate 100 and at a first edge of the gate structure (that is, the source region 306 is located at a left side of the channel region 308), and a drain region located in the substrate 100 and at a second edge of the gate structure (that is, the drain region 305 is located at a right side of the channel region 308).

Figure 4:
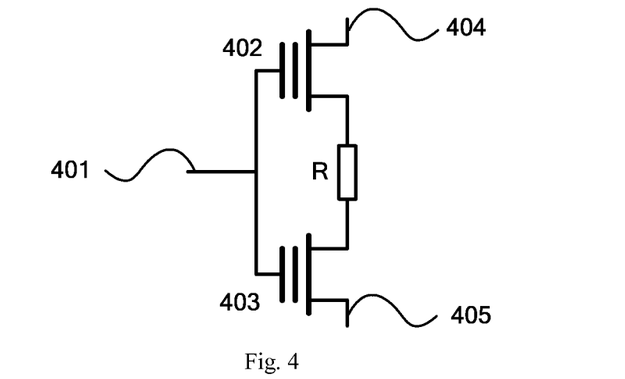
FIG. 4 is a logic equivalent diagram showing the SONOS memory shown in FIG. 3.

FIG. 4 is a logic equivalent diagram of the SONOS memory 300. Functionally, the SONOS memory 300 may be equivalent to two transistors 402 and 403 between which an equivalent resistor R is connected in series. Also with reference to FIG. 3, two bits of information bit 1 and bit 2 may be stored in the memory 300. Specifically, bit 1 is stored in a portion of the trapping layer 303 (i.e., the silicon nitride layer 303) adjacent to the source region 306 to be used as a storage bit, and bit 2 is stored in a portion of the trapping layer 303 (i.e., the silicon nitride layer 303) adjacent to the drain region 305 to be used as a selection bit, that is, one of the two transistors 402 and 403 is used as a storage transistor while the other is used as a selection transistor, and the storage transistor and the selection transistor share one gate 401 (corresponding to the gate 301 in FIG. 3), thus realizing a double-transistor function in only one transistor 300. A source region 404 (corresponding to the source region 306 in FIG. 3) of the transistor 300 and a drain region 406 (corresponding to the drain region 305 in FIG. 3) of the transistor 300 are shown in FIG. 4.

Figure 5:
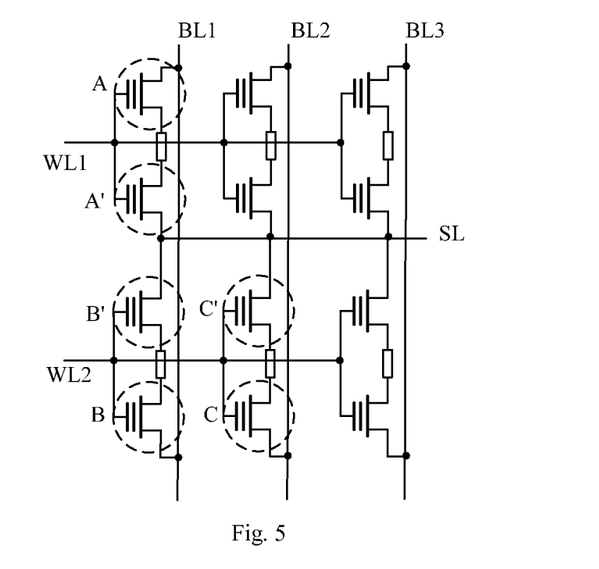
FIG. 5 is an equivalent circuit diagram showing a NOR type flash array formed by the SONOS memory according to one embodiment of the present disclosure.

A NOR flash array formed by above SONOS memory 300 may be referred to as a single-transistor parallel structure. FIG. 5 is an equivalent circuit diagram showing the NOR flash array formed by the SONOS memory according to one embodiment of the present disclosure. As shown in FIG. 5, the NOR flash array comprises six memory cells arranged in two rows (a first direction) and three columns (a second direction). It should be noted that, a number of the memory cells six is explanatory and illustrative, which is used to generally understand the present disclosure, and should not be construed to limit the present disclosure. Any two adjacent memory columns are isolated from each other. For instance, an isolation between adjacent memory columns may be realized by a STI (shallow trench isolation) structure. The memory cell is the SONOS memory 300 shown in FIG. 4. The gate 401 of each memory cell 300 in a same row is connected together via a word line WL so that the NOR flash array comprises two word lines (WL1 and WL2) arranged in parallel in the second direction. The source regions 404 of all memory cells in the NOR flash array are connected together via a source line SL, that is, each memory cell 300 in the NOR flash array has a common source. The drain 405 of each memory cell 300 in a same column is connected together via a bit line BL so that the NOR flash array comprises three bit lines (BL1, BL2 and BL3) arranged in parallel in the first direction. The bit lines BL cross the word lines WL and the source line SL respectively. Two adjacent memory cells 300 in each memory cell column are connected in series opposition to allow the source regions 404 of the two adjacent memory cells to be connected to the source line SL, or to allow the drain regions 405 of the two adjacent memory cells to be connected to a same bit line BL, so as to increase a spacial utilization rate.

An operation of the NOR flash memory array structure according to embodiments of the present disclosure will be illustrated as follows. Specifically, the operation comprises: reading, programming and erasing.

(1) Reading Operation

Figure 6:
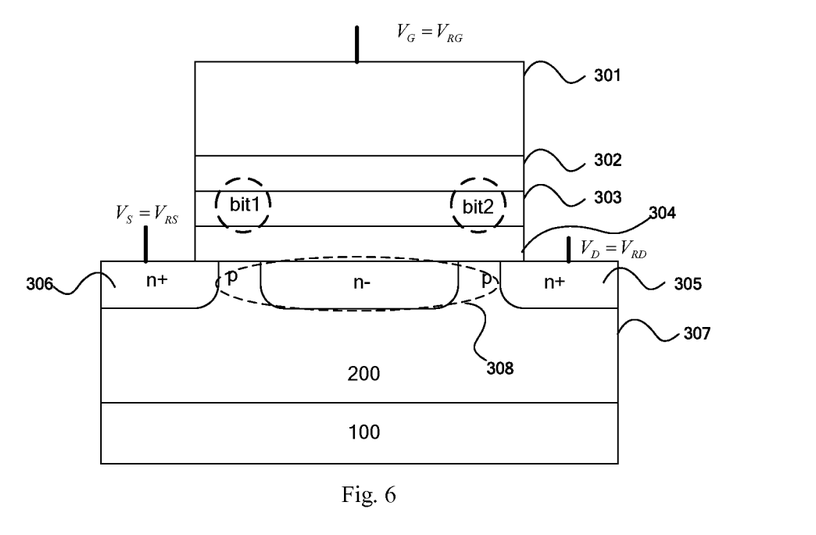
FIG. 6 is a schematic view showing each bias voltage during a reading operation of the SONOS memory according to one embodiment of the present disclosure.

Assuming a memory cell AA' in FIG. 5 being selected for reading, an operation thereof comprises: applying a positive first reading voltage $V_{RD}$ to a bit line BL1 to which the memory cell AA' belongs to, where $V_{RD}$ may ranges from 0V to 2V; applying a positive third reading voltage $V_{RS}$ to rest bit lines (such as BL2) unselected, where $V_{RS}$ may range from 2V to 8V; applying a positive second reading voltage $V_{RG}$ to a word line WL1 to which the memory cell AA' belongs to, where $V_{RG}$ may range from 2V to 6V; grounding rest word lines (such as WL2) unselected; applying the third reading voltage $V_{RS}$ to the source line SL; and grounding the p-well 200. Above each applied voltage during the reading operation of the SONOS memory according to one embodiment is shown in FIG. 6. A voltage $V_S=V_{RS}$ is applied to the source region 306, a voltage $V_D=V_{RD}$ is applied to the drain region 305, and a voltage $V_G=V_{RG}$ is applied to the gate 301. The memory bit 1 is corresponding to a selection bit A' of the memory cell AA', the memory bit 2 is corresponding to a storage bit A of the memory cell AA', and bit 1 and bit 2 share one gate 301. A reading principle is that under above bias voltages, for the selected memory cell 300, because a larger voltage is applied to the source region 306, an information stored in the source region 306 is shielded and an information stored in the drain region 305 is a reading result.

Figure 7:
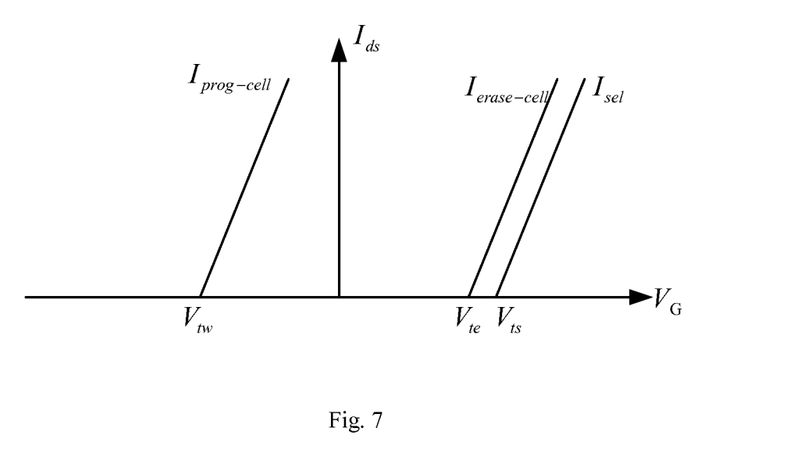
FIG. 7 is a graph showing a relation between a gate voltage $V_G$ and a drain current $I_{ds}$ of a memory cell under a lower source/drain voltage.

FIG. 7 is a graph showing a relation between a gate voltage $V_G$ and a drain current $I_{ds}$ of a memory cell under a lower source/drain voltage. Three curves $I_{prog-cell}$, $I_{erase-cell}$, $I_{sel}$ in FIG. 7 represent relations between the gate voltage $V_G$ and the drain current $I_{ds}$ of a storage bit in programming status, a storage bit in erasing status and a selection bit respectively, where $V_{tw}$ is a threshold voltage of the storage bit in programming status, $V_{te}$ is a threshold voltage of the storage bit in erasing status, and $V_{ts}$ is a threshold voltage of the selection bit. Since the programming operation is never performed to the selection bit, the selection bit will always be in erasing status. However, when every time the erasing operation is performed to the storage bit, a slight influence may be produced to the selection bit so that a threshold voltage of the selection bit in erasing status is higher than that of the storage bit in erasing status. It can also be seen that, after performing a programming operation to the storage bit, the threshold voltage of the storage bit changes from a positive voltage $V_{te}$ to a negative voltage $V_{tw}$.

Figure 8:
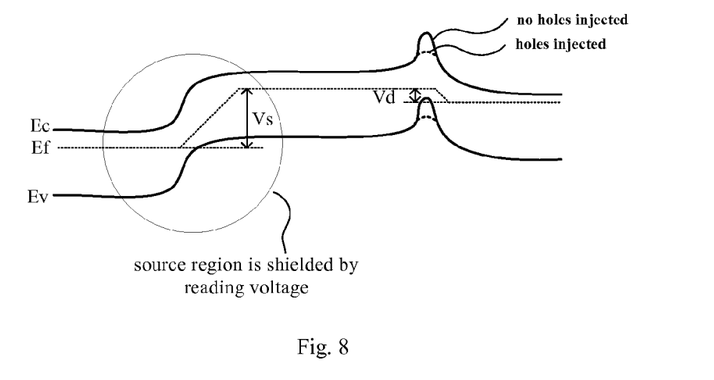
FIG. 8 is a schematic diagram showing an energy band in a length direction of a channel region during the reading operation of the SONOS memory according to one embodiment of the present disclosure.

FIG. 8 is a schematic diagram showing an energy band in a length direction of a channel region during the reading operation of the SONOS memory according to one embodiment of the present disclosure. It can be seen clearly from FIG. 8 that, when a barrier of the source region is shielded by the reading voltage, a status of the drain region may be obtained according to an existence of holes in the trapping layer close to the drain region.

Figure 9:
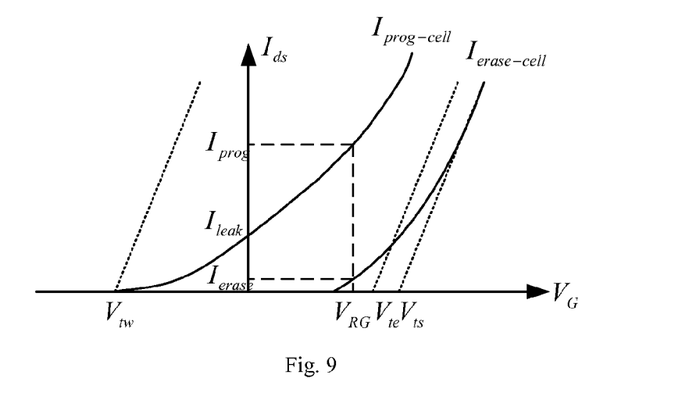
FIG. 9 is a graph showing a relation between the gate voltage $V_G$ and the drain current $I_{ds}$ of the memory cell under a proper source region voltage.

As shown in FIG. 6, under a proper $V_{RS}$, because a DIBL (drain induced barrier lowering) effect may be generated in the source region 306, each threshold voltage will be lower than that of a situation (shown in FIG. 8) under the lower source/drain voltage. As shown in FIG. 9, the threshold voltage $V_{ts}$ of the selection bit in erasing status and the threshold voltage $V_{te}$ of the storage bit in erasing status are both reduced. In FIG. 9, current curves $I_{ds}$-$V_G$ of the storage bit in programming status, the storage bit in erasing status and the selection bit (which are corresponding to the three curves shown in FIG. 8 respectively) under a lower $V_{RS}$ are represented in dashed lines, while current curves $I_{ds}$-$V_G$ of the storage bit in programming status and the storage bit in erasing status under the proper $V_{RS}$ are represented in a solid line. In this embodiment, provided that $V_{RS}$=$V_{DD}$ ($V_{DD}$ is a voltage of a power supply) and $V_{RD}$=0, if the storage bit A is in programming status, a current $I_{prog}$ may be generated in the storage bit A by an action of a gate voltage $V_{RG}$; if the storage bit A is in erasing status, a current $I_{erase}$ may be generated in the storage bit A. The currents $I_{prog}$ and $I_{erase}$ are transmitted to a SA (sensitive amplifier) via the bit line BL1, and then the reading of the storage bit A is completed by a SA circuit.

When reading certain memory cell (such as the memory cell AA' in FIG. 5) in the array, a crosstalk may be generated in its adjacent memory cells (such as memory cells BB' and CC' in FIG. 5, where B' is a selection bit corresponding to a storage bit B, and C' is a selection bit corresponding to a storage bit C). When reading the memory cell AA', since $V_{RS}$ is applied to the source line SL1, and $V_{RD}$ is applied to the bit line BL1, the memory cells BB' and CC' unselected are also influenced by $V_{RS}$ and $V_{RD}$. However, an influence on the memory cell CC' may be ignored because it is slight. Thus, just the memory cell BB' is taken into account herein. The word line WL2 unselected is grounded, and thus for the memory cell BB', $V_G$=0 and a leakage current $I_{leak}$ as shown in FIG. 9 is produced. A leakage current is very low when the cell B is in erasing status, so only the $I_{leak}$ in programming status of the cell B is considered. The leakage current $I_{leak}$ is transmitted to the SA via the bit line BL1. Therefore, $I_{leak}$ may influence the reading of the memory cell AA' to cause a fault reading result when $I_{leak}$ is not small enough.

Figure 10:
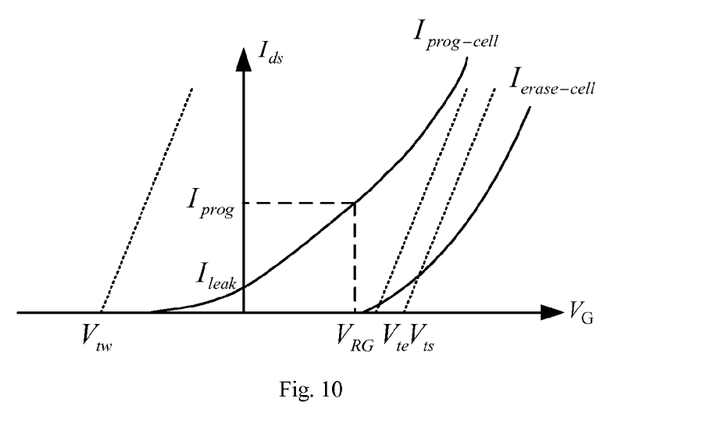
FIG. 10 is a graph showing a relation between the gate voltage $V_G$ and the drain current $I_{ds}$ of the memory cell while retaining a source region voltage but properly increasing a drain region voltage.

In order to solve the crosstalk problem, a reading method for adjusting a drain region voltage of the NOR flash array is provided according to a preferred embodiment of the present disclosure. As shown in FIG. 10, the drain region voltage $V_{RD}$ is properly increased while the source region voltage $V_{RS}$ remains unchanged. In this embodiment, $V_{RS}$=$V_{DD}$, $V_{RD}$=⅓$V_{DD}$. Since a difference between the source region voltage and the drain region voltage is reduced, the DIBL effect is reduced and the threshold voltages are increased. Moreover, the current curves shift to right with the increase of the drain region voltage $V_{RD}$. It can be seen from FIG. 10 that, the leakage current $I_{leak}$ is reduced obviously, thus decreasing the influence on the reading of the memory cell AA', and reducing a reading fault rate as well as a reading power consumption.

(2) Programming Operation

Figure 11:
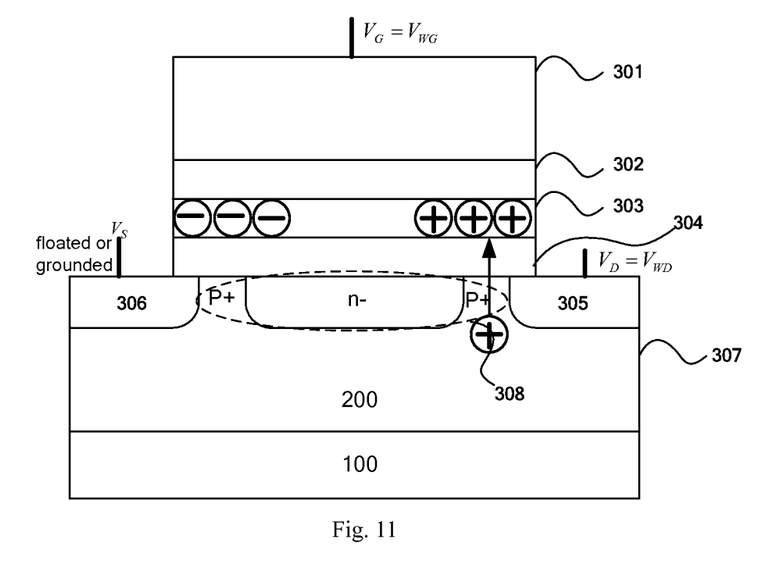
FIG. 11 is a schematic view showing each bias voltage during a programming operation of the SONOS memory according to one embodiment of the present disclosure.

In the embodiment, a BBHH (band-to-band hot hole) injection is introduced in the programming operation. The programming operation comprises: applying a positive voltage $V_{WD}$ to the bit line BL to which the selected memory cell belongs to, where $V_{WD}$ preferably ranges from 2V to 6V; grounding rest bit lines unselected; applying a negative voltage $V_{WG}$ to the word line WL to which the selected memory cell belongs to, where $V_{WG}$ preferably ranges from −4V to −15V; grounding rest word lines unselected; floating or grounding the source line SL; and grounding the p-well. Each applied voltage above during the programming operation of the SONOS memory according to one embodiment is shown in FIG. 11. The source region 306 is floated or grounded, a voltage $V_D$=$V_{WD}$ is applied to the drain region 305, and a voltage $V_G$=$V_{RG}$ is applied to the gate 301. In this case, holes injected will be trapped by charge traps in the charge trapping layer near the drain region of the memory cell selected to change the threshold voltage of the memory cell selected. In addition, since a distribution region of the holes injected in the silicon nitride layer is narrower than that of electrons, a crosstalk between two adjacent bits may be avoided to some extent, and thus is favorable for a reduction of a device size.

A programming principle is that when a positive voltage is applied to the drain region, a higher negative voltage is applied to the gate and the substrate is grounded, a high longitudinal electric field is established in an overlap region between the gate and the drain region, while a pn junction between the drain region and the substrate is biased in a high reverse transverse electric field. An energy band of a drain junction edge is upward curved with a joint action of the longitudinal electric field and the transverse electric field, and a deep depletion thus occurs. When a curve of the energy band is larger than an energy gap of silicon, and electrons in valence band can tunnel a barrier to a conduction band to form electron-hole pairs, a band-to-band tunneling effect occurs. Electrons produced by the band-to-band tunneling effect will be collected by the drain region, and a majority of holes produced by the band-to-band tunneling effect will cross the pn junction under an acceleration of the transverse electric field of the pn junction and then be collected by the substrate, while a minority of holes with high energy will tunnel a Si/SiO$_2$ barrier under an attraction of a gate electric field and then be injected into the silicon nitride layer, that is, the BBHH injection occurs. When the holes are injected into the silicon nitride layer above the drain region, an energy band in a length direction of the channel region may be changed because of an injection of the holes (that is, a partial energy band corresponding to a hole injection region is downward curved), thus realizing an information storage.

(3) Erasing Operation

Figure 12:
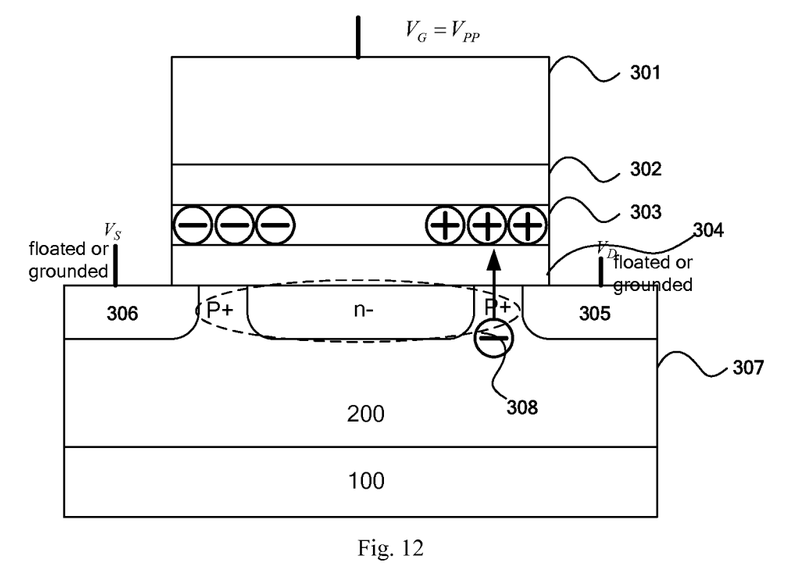
FIG. 12 is a schematic view showing each bias voltage during an erasing operation of the SONOS memory according to one embodiment of the present disclosure.

The erasing operation according to embodiments of the present disclosure is based on a channel F-N tunneling injection effect. The erasing operation comprises: applying a positive first erasing voltage $V_{pp}$ to all word lines WL, where $V_{pp}$ preferably ranges from 5V to 20V; floating or grounding the source line SL and all bit lines BL; grounding the p-well. Each applied voltage above during the erasing operation of the SONOS memory according to one embodiment is shown in FIG. 12. The source region 306 and the drain region 305 is floated or grounded, and a voltage $V_G$=$V_{pp}$ is applied to the gate 301. In this case, electrons injected will be trapped by the charge traps in the silicon nitride layer near the drain region of the memory cell selected to counteract holes injected during the programming operation.

As shown in FIG. 12, under above biased voltages, a strong electric field is established between the silicon nitride layer 303 and the channel region, electrons in the channel region will tunnel to the silicon nitride layer 303 by a F-N tunneling effect and counteract holes in the silicon nitride layer 303, thus realizing the erasing operation. The channel F-N tunneling injection effect is an uniform tunneling along the whole channel region. However, in practice, only the hole injection region generated during the programming operation needs to be injected with electrons. Because the channel region of the memory cell is nonuniformly doped, there is a difference in an electron tunneling probability along the channel length direction during a F-N tunneling process. In a p-type region of the channel, the longitudinal electric field is larger, and the electron tunneling probability is larger accordingly, while in an n-type region of the channel, the longitudinal electric field is smaller, and the electron tunneling probability is smaller accordingly, so that a non-uniform tunneling is realized.

An alternative erasing operation is provided according to another embodiment. The erasing operation comprises: applying a positive second erasing voltage $V_{pp}'$ to all word lines WL, where $V_{pp}'<V_{pp}$; applying a negative second erasing voltage $-V_{pp}'$ to all bit lines BL and the p-well; floating the source line SL. By this method, the gate voltage $V_{pp}$ is reduced, the peripheral control circuit is simplified, and a reliability of the erasing operation is improved.

The NOR flash memory array structure and the operation thereof are provided according to the first aspect of the present disclosure. By forming the NOR flash memory array structure with double-bit SONOS memory cells, the single-transistor parallel structure is realized. By applying the NOR flash memory array structure to an independent NOR flash, the peripheral control circuit may be simplified and an erasing speed may be increased; by applying the NOR flash memory array structure to an embedded NOR flash, problems (such as leakage and reading fault) resulting from the over erasing may be avoided, and the storage density may be greatly increased. Moreover, the reading method for adjusting the drain region voltage of the NOR flash array is provided, which may obviously reduce the leakage current and reduce the reading fault rate as well as the reading power consumption. In addition, a reverse voltage erasing method is provided particularly for the NOR flash memory array structure, which may reduce the gate voltage, the peripheral simplify the control circuit, and improve the reliability of the erasing operation.

According to a second aspect of the present disclosure, a mixed nonvolatile flash memory comprising the NOR flash memory array structure according to the first aspect of the present disclosure is provided. By using a high density double-bit non-uniform channel device as the memory cell to form a NOR array (the first memory array) and a NAND array (the second memory array) on a same chip, a single-chip mixed storage of a NOR flash and a NAND flash is thus realized.

Figure 13:
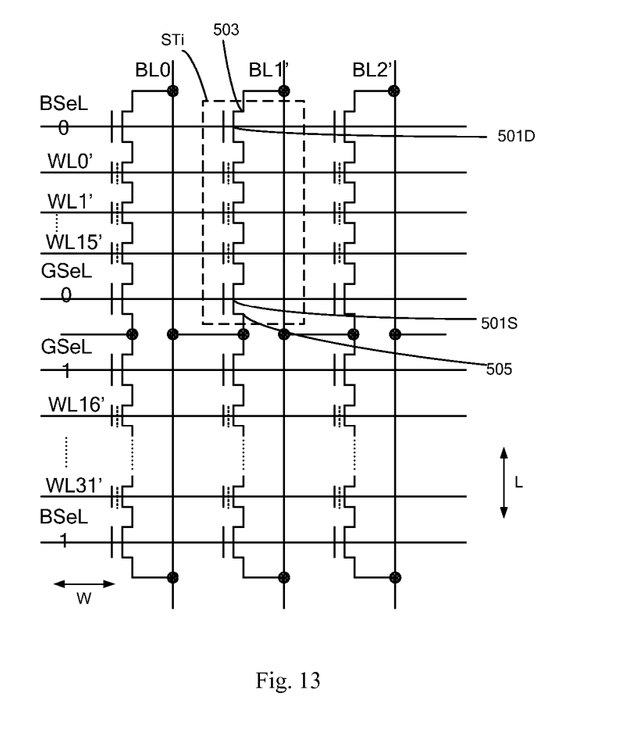
FIG. 13 is an equivalent circuit diagram showing a NAND type flash array formed by the SONOS memory according to one embodiment of the present disclosure.

FIG. 13 is an equivalent circuit diagram showing the NAND type flash array formed by the SONOS memory according to one embodiment of the present disclosure. As shown in FIG. 13, the NAND type flash array comprises: six serial structures STi arranged in two rows (the first direction W) and three columns (the second direction L). It should be noted that, a number of the serial structures six is explanatory and illustrative, which is used to generally understand the present disclosure, and should not be construed to limit the present disclosure. Each serial structure STi includes one first selection transistor 501D (i.e., bit line selection transistor 501D), 16 SONOS memory cells and one second selection transistor 501S (i.e., source line selection transistor 501S) connected sequentially in the column direction. Two adjacent serial structures STi in the first direction are isolated from each other. For instance, an isolation between adjacent serial structures STi may be realized by the STI structure. A number of the SONOS memory cells included in each serial structure STi may be but not limited to 16 as shown in FIG. 13. The gate of each memory cell in a same row is connected together via a second word line WL (WL0', WL1' ... or WL15'), while the gate of each bit line selection transistor 501D in a same row is connected together via a first selection line BSeL (BSeL0 or BSeL1). The gate of each source line selection transistor 501S in a same row is connected together via a second selection line GSeL (GSeL0 or GSeL1). The second bit lines BL' cross the second word lines WL', and the first selection lines BSeL cross the second selection lines GSeL.

In one embodiment, two adjacent serial structures STi in the column direction are connected in series opposition, that is, in the column direction, the drain regions 503 of the bit line selection transistors 501D in two adjacent serial structures STi are connected to one second bit line BLi', and the source regions 505 of the source line selection transistors 501S in two adjacent serial structures STi are connected to a previous second bit line BLi−1', where i is a series number of the second bit lines BL'. This structure is helpful to simplify a structure of the NAND array, thus reducing the area of the memory chip.

The single memory cell in the NAND type array may not only realize one-bit storage, double-bit storage and multi-level storage, but also realize programming and forward and reverse reading. The NAND type array structure has advantages of mass data storage capacity, flexible operation, small cell area, high integration, low power consumption, low cost, thus meeting requirements of small size and high density for the nonvolatile developments.

The mixed nonvolatile flash memory based on a double-bit non-uniform channel device is provided according to the second aspect of the present disclosure. The mixed nonvolatile flash memory not only has advantages of small size and high density of the NAND flash, but also has advantages of high reading speed and local execution of code of the NOR flash. In addition, because the double-bit non-uniform channel device is used as the memory cell of the NOR array, compared with a conventional NOR flash, the mixed nonvolatile flash memory has a higher storage density. Furthermore, the NOR array and the NAND array of the double-bit non-uniform channel device may be fabricated by an identical process flow so that a real integration of the eNOR flash and the NAND flash may be realized, which may not only reduce the area of the memory chip, but also has advantages of NAND mass data storage capacity and NOR fast program storage.

Figure 14:
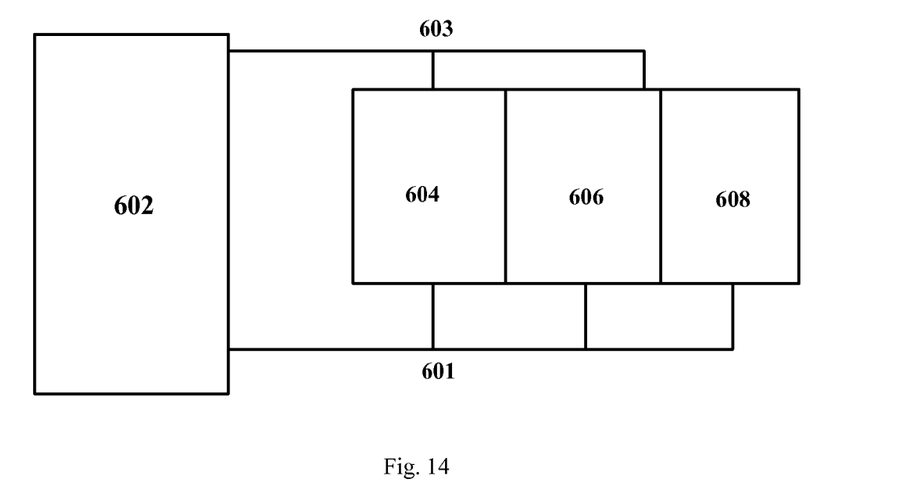
FIG. 14 is a schematic structural view showing a memory system comprising a mixed nonvolatile flash memory according to one embodiment of the present disclosure.

According to a third aspect of the present disclosure, a memory system comprising the mixed nonvolatile flash memory according to the second aspect of the present disclosure is provided. As shown in FIG. 14, the NOR type array of the mixed nonvolatile flash memory is a program memory 606 for storing a program to realize the fast reading and local execution of code, and the NAND type array of the mixed nonvolatile flash memory is a data memory 608 for storing data to realize mass capacity data storage. The memory system may be applied to various smart cards for identifying information, such as an ID smart card, a phone smart card, a mobile SIM card, and also may be applied to memory cards for storing information, such as a safety digital SD card. By integrating the NOR type array and the NAND type array in the mixed nonvolatile flash memory, both mass data storage capacity and high program running speed may be realized.

Moreover, it is helpful to simplify a product configuration, improve running speed of the system and reduce the power consumption of the system.

A memory system applied in the smart card is taken as an example to illustrate the present disclosure. As shown in FIG. 14, the memory system comprises: a microprocessor MCU 602, a random access memory RAM 604, a program memory 606 and a data memory 608. The program memory 606, the data memory 608 and RAM 604 are connected with the microprocessor MCU 602 respectively to execute storage commands under a control of the microprocessor MCU 602. Specifically, the program memory 606, the data memory 608 and RAM 604 are connected with the microprocessor MCU 602 via an address bus 601 and a data bus 603 respectively. RAM 604 is for temporarily storing programs and data, the program memory 606 is for storing programs requiring fast reading and running, and the data memory 608 is for storing data with mass capacity.

Reference throughout this specification to "an embodiment", "some embodiments", "one embodiment", "an example", "a specific examples", or "some examples" means that a particular feature, structure, material, or characteristic described in connection with the embodiment or example is included in at least one embodiment or example of the disclosure. Thus, the appearances of the phrases such as "in some embodiments", "in one embodiment", "in an embodiment", "an example", "a specific examples", or "some examples" in various places throughout this specification are not necessarily referring to the same embodiment or example of the disclosure. Furthermore, the particular features, structures, materials, or characteristics may be combined in any suitable manner in one or more embodiments or examples.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A NOR flash memory array structure, comprising:
   a substrate; and
   a two dimensional memory array structure formed on the substrate and comprising:
   a plurality of memory cell columns arranged in parallel in a first direction, two adjacent memory cell columns isolated from each other and each memory cell column including a plurality of memory cells, wherein each memory cell comprises: a channel region located on the substrate, a gate structure located on the channel region and formed by a tunneling oxide layer, a silicon nitride layer, a barrier oxide layer and a polysilicon gate layer stacked sequentially, a source region located in the substrate and at a first edge of the gate structure, and a drain region located in the substrate and at a second edge of the gate structure;
   a plurality of word lines arranged in parallel in a second direction and each configured to connect the gate structures of the memory cells in a same row;
   a source line for connecting the source regions of all the memory cells; and
   a plurality of bit lines arranged in parallel in the first direction and each configured to connect the drain regions of the memory cells in a same column, the plurality of bit lines crossing the plurality of word lines and the source line,
   wherein the substrate is a p-type semiconductor substrate, and each memory cell comprises: a p-well formed in the p-type semiconductor substrate, and the channel region formed on the p-well and non-uniformly doped in a horizontal direction with p+/n−/p+, p+/p−/p+, or p+/depletion region/p+.

2. The NOR flash memory array structure according to claim 1, wherein each memory cell stores two bits of information with one bit as a storage bit and the other bit as a selection bit.

3. The NOR flash memory array structure according to claim 2, wherein the two bits of information are stored in portions of the silicon nitride layer adjacent to the source region and the drain region respectively.

4. The NOR flash memory array structure according to claim 1, wherein two adjacent memory cells in each memory cell column are connected in series opposition to allow the source regions of the two adjacent memory cells to be connected to the source line, or to allow the drain regions of the two adjacent memory cells to be connected to a same bit line.

5. A mixed nonvolatile flash memory, comprising:
   a semiconductor substrate;
   a first memory array formed on the semiconductor substrate and comprising:
   a plurality of memory cell columns arranged in parallel in a first direction, two adjacent memory cell columns isolated from each other and each memory cell column including a plurality of first memory cells;
   a plurality of first word lines arranged in parallel in a second direction and each configured to connect gate structures of the first memory cells in a same row;
   a first source line in the second direction for connecting source regions of all the first memory cells; and
   a plurality of first bit lines arranged in parallel in the first direction and each configured to connect drain regions of the first memory cells in a same column, the plurality of first bit lines crossing the plurality of first word lines and the first source line; and
   a second memory array formed on the semiconductor substrate and comprising:
   a plurality of serial structures arranged in parallel in the first direction and in the second direction, each serial structure including one first selection transistor, a plurality of second memory cells and one second selection transistor, two adjacent serial structures in the first direction isolated from each other;
   a plurality of second word lines arranged in parallel in the second direction and each configured to connect gate structures of the second memory cells in a same row;
   a plurality of first selection lines arranged in parallel in the second direction and each configured to connect gate electrodes of the first selection transistors in a same row;
   a plurality of second selection lines arranged in parallel in the second direction and each configured to connect gate electrodes of the second selection transistors in a same row; and
   a plurality of second bit lines arranged in parallel in the first direction, the plurality of second bit lines crossing the plurality of first selection lines and the plurality of second selection lines, drain regions of the first selection transistors of the serial structures in a same column connected with one of the second bit lines which are adjacent to the serial structures in the same column, source regions of the second selection transistors of the serial structures in the same column connected with the other of the second bit lines which are adjacent to the serial structures in the same column;
   wherein structures of the first memory cell and the second memory cell are identical, and each of the first memory cell and the second memory cell comprises: a channel region located on the semiconductor substrate, a gate structure located on the channel region and formed by a tunneling oxide layer, a silicon nitride layer, a barrier oxide layer and a polysilicon gate layer stacked sequentially, a source region located in the substrate and at a first edge of the gate structure, and a drain region located in the substrate and at a second edge of the gate structure; and wherein the semiconductor substrate is a p-type semiconductor substrate, and each first memory cell and each second memory cell each comprise: a p-well formed in the p-type semiconductor substrate, and the channel region formed on the p-well and non-uniformly doped in a horizontal direction with p+/n−/p+, p+/p−/p+, or p+/depletion region/p+.

6. The mixed nonvolatile flash memory according to claim 5, wherein each first memory cell and each second memory cell each store two bits of information with one bit as a storage bit and the other bit as a selection bit.

7. The mixed nonvolatile flash memory according to claim 6, wherein the two bits of information are stored in portions of the silicon nitride layer adjacent to the source region and the drain region respectively.

8. The mixed nonvolatile flash memory according to claim 5, wherein two adjacent first memory cells in each memory cell column are connected in series opposition to allow the source regions of the two adjacent first memory cells to be connected to the first source line, or to allow the drain regions of the two adjacent first memory cells to be connected to a same first bit line.

9. The mixed nonvolatile flash memory according to claim 5, wherein two adjacent serial structures in the second direction are connected in series opposition to allow the drain regions of the first selection transistors in the two adjacent serial structures to be connected to one second bit line adjacent to the two adjacent serial structures, or to allow the source regions of the second selection transistors in the two adjacent serial structures to be connected to the other second bit line adjacent to the two adjacent serial structures.

10. A memory system, comprising a mixed nonvolatile flash memory, wherein the mixed nonvolatile flash memory comprises:
a semiconductor substrate;
a first memory array formed on the semiconductor substrate and comprising:
a plurality of memory cell columns arranged in parallel in a first direction, two adjacent memory cell columns isolated from each other and each memory cell column including a plurality of first memory cells;
a plurality of first word lines arranged in parallel in a second direction and each configured to connect gate structures of the first memory cells in a same row;
a first source line in the second direction for connecting source regions of all the first memory cells; and
a plurality of first bit lines arranged in parallel in the first direction and each configured to connect drain regions of the first memory cells in a same column, the plurality of first bit lines crossing the plurality of first word lines and the first source line; and
a second memory array formed on the semiconductor substrate and comprising:
a plurality of serial structures arranged in parallel in the first direction and in the second direction, each serial structure including one first selection transistor, a plurality of second memory cells and one second selection transistor, two adjacent serial structures in the first direction isolated from each other;
a plurality of second word lines arranged in parallel in the second direction and each configured to connect gate structures of the second memory cells in a same row;
a plurality of first selection lines arranged in parallel in the second direction and each configured to connect gate electrodes of the first selection transistors in a same row;
a plurality of second selection lines arranged in parallel in the second direction and each configured to connect gate electrodes of the second selection transistors in a same row; and
a plurality of second bit lines arranged in parallel in the first direction, the plurality of second bit lines crossing the plurality of first selection lines and the plurality of second selection lines, drain regions of the first selection transistors of the serial structures in a same column connected with one of the second bit lines which are adjacent to the serial structures in the same column, source regions of the second selection transistors of the serial structures in the same column connected with the other of the second bit lines which are adjacent to the serial structures in the same column;
in which structures of the first memory cell and the second memory cell are identical, and each of the first memory cell and the second memory cell comprises: a channel region located on the semiconductor substrate, a gate structure located on the channel region and formed by a tunneling oxide layer, a silicon nitride layer, a barrier oxide layer and a polysilicon gate layer stacked sequentially, a source region located in the substrate and at a first edge of the gate structure, and a drain region located in the substrate and at a second edge of the gate structure; and
in which the semiconductor substrate is a p-type semiconductor substrate, and each first memory cell and each second memory cell comprise: a p-well formed in the p-type semiconductor substrate, and the channel region formed on the p-well and non-uniformly doped in a horizontal direction with p+/n−/p+, p+/p−/p+, or p+/depletion region/p+.

11. The memory system according to claim 10, wherein each first memory cell and each second memory cell store two bits of information, which are stored in portions of the silicon nitride layer adjacent to the source region and the drain region respectively.

12. The memory system according to claim 10, wherein two adjacent first memory cells in each memory cell column are connected in series opposition to allow the source regions of the two adjacent first memory cells to be connected to the first source line, or to allow the drain regions of the two adjacent first memory cells to be connected to a same first bit line.

13. The memory system according to claim 10, wherein two adjacent serial structures in the second direction are connected in series opposition to allow the drain regions of the first selection transistors in the two adjacent serial structures to be connected to one second bit line adjacent to the two adjacent serial structures, or to allow the source regions of the second selection transistors in the two adjacent serial structures to be connected to the other second bit line adjacent to the two adjacent serial structures.

14. The memory system according to claim 10, wherein the first memory array is a program memory for storing a program, and the second memory array is a data memory for storing data.

15. The memory system according to claim 14, further comprising:
  a microprocessor; and
  a random access memory for temporarily storing data;
  wherein the program memory, the data memory and the random access memory are connected with the microprocessor respectively to execute storage commands under a control of the microprocessor.

16. The memory system according to claim 15, wherein the program memory, the data memory and the random access memory are connected with the microprocessor via an address bus and a data bus respectively.

* * * * *